(12) United States Patent
Onodera et al.

(10) Patent No.: US 8,771,458 B2
(45) Date of Patent: Jul. 8, 2014

(54) METHOD OF MAKING WIRING BOARDS COVERED BY THERMOTROPIC LIQUID CRYSTAL POLYMER FILM

(75) Inventors: Minoru Onodera, Kurashiki (JP); Tadao Yoshikawa, Kurashiki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 49 days.

(21) Appl. No.: 11/996,874

(22) PCT Filed: Jul. 19, 2006

(86) PCT No.: PCT/JP2006/314242
§ 371 (c)(1),
(2), (4) Date: Jan. 25, 2008

(87) PCT Pub. No.: WO2007/013330
PCT Pub. Date: Feb. 1, 2007

(65) Prior Publication Data
US 2009/0065240 A1    Mar. 12, 2009

(30) Foreign Application Priority Data
Jul. 27, 2005    (JP) .................................. 2005-217078

(51) Int. Cl.
| | |
|---|---|
| *H05K 7/20* | (2006.01) |
| *B32B 3/00* | (2006.01) |
| *B32B 37/04* | (2006.01) |

(52) U.S. Cl.
USPC ..................................... 156/308.2; 156/309.6

(58) Field of Classification Search
USPC ....................................................... 156/308.2
See application file for complete search history.

(56) References Cited

U.S. PATENT DOCUMENTS

| 6,274,242 B1 * | 8/2001 | Onodera et al. ........... 428/411.1 |
| 6,616,796 B1 | 9/2003 | Onodera et al. |

(Continued)

FOREIGN PATENT DOCUMENTS

| CN | 1268429 A | 10/2000 |
| JP | 60-186527 | 9/1985 |

(Continued)

OTHER PUBLICATIONS

Nelson, Ashley M.; Long, Timothy E. "Stilbene-Containing Thermotropic Liquid Crystalline Polyesters for Aerospace Applications." Department of Chemistry, Macromolecules and Interfaces Institute. Virginia Tech, Blacksburg, VA. 24061. pp. 1-6.*

(Continued)

*Primary Examiner* — Philip Tucker
*Assistant Examiner* — Vicki Wu
(74) *Attorney, Agent, or Firm* — Oblon, Spivak, McClelland, Maier & Neustadt, L.L.P.

(57) ABSTRACT

The object of the invention is to provide a wiring board having the uniform quality at a high yield which is produced by hot-pressing and laminating on a wiring board base material a thermotropic liquid crystal polymer which is excellent as a wiring board covering material.
The present invention provides a method of making a wiring board comprising: hot-pressing and laminating a thermotropic liquid crystal polymer film on a wiring board base material on the surface of which at least one layer containing a electro-conductive circuit is exposed, characterized by that a viscoelastic characteristic of the thermotropic liquid crystal polymer film is measured at a low frequency within a laminating temperature region and the hot-pressing is carried out at a temperature selected so that the viscoelastic characteristic falls within a predetermined range.

5 Claims, 3 Drawing Sheets

(56) References Cited

U.S. PATENT DOCUMENTS

| | | |
|---|---|---|
| 7,052,574 B2 | 5/2006 | Onodera et al. |
| 7,465,420 B2 * | 12/2008 | Yoshikawa et al. ........... 264/564 |
| 2004/0040651 A1 | 3/2004 | Tsugaru et al. |
| 2005/0232603 A1 * | 10/2005 | Takemoto ....................... 386/96 |
| 2006/0151106 A1 | 7/2006 | Hiraishi et al. |

FOREIGN PATENT DOCUMENTS

| | | |
|---|---|---|
| JP | 3-504948 | 10/1991 |
| JP | 4-202796 | 7/1992 |
| JP | 5 42603 | 2/1993 |
| JP | 6 283849 | 10/1994 |
| JP | 9-135067 | 5/1997 |
| JP | 11-214250 | 8/1999 |
| JP | 11-302417 | 11/1999 |
| JP | 2000-269616 | 9/2000 |
| JP | 2000 286537 | 10/2000 |
| JP | 2001 244630 | 9/2001 |
| JP | 2001244630 A * | 9/2001 |
| JP | 2002-331589 | 11/2002 |
| JP | 2003-110053 | 4/2003 |
| JP | 2004-59084 | 2/2004 |
| JP | 2004-111942 | 4/2004 |
| JP | 2004-358677 | 12/2004 |
| JP | 2006285178 A * | 10/2006 |
| TW | 436510 B | 5/2001 |
| TW | 544444 B | 8/2003 |
| WO | WO 89/12547 | 12/1989 |
| WO | WO 01/68755 A1 | 9/2001 |

OTHER PUBLICATIONS

Office Action issued Sep. 5, 2013, in Korean Patent Application No. 10-2008-7001831 (with partial English-language translation).

Japanese Office Action issued Apr. 12, 2011, in Patent Application No. 2007-528423 (with English-language translation).

Office Action issued Mar. 28, 2013 in Korean Patent Application No. 10-2008-7001831 (with partial English translation).

Office Action issued Sep. 16, 2011 in China Application No. 200680026327.X.

Office Action issued Aug. 27, 2012 in Taiwanese Patent Application No. 095127053 with partial English language translation.

Korean Office Action issued Sep. 6, 2012, in Korea Patent Application No. 10-2008-7001831.

* cited by examiner

Fig. 2

METHOD OF MAKING WIRING BOARDS COVERED BY THERMOTROPIC LIQUID CRYSTAL POLYMER FILM

BACKGROUND OF THE INVENTION

1. Field of the Invention

The present invention relates to a method of making a wiring board having an electroconductive circuit covered with a film made of a thermotropic liquid crystal polymer (which film is hereinafter referred to as a thermotropic liquid crystal polymer film), a wiring board manufactured by such wiring board making method, and a liquid crystal polymer film conditioned for use with such wiring board.

2. Description of the Prior Art

In recent years, demands have increased for reduction in size and weight of electronics such as, for example, cellular phones, digital cameras, personal computers and printer and, in accord therewith, flexible wiring boards and multilayer wiring boards come to be largely utilized.

Figure 1:
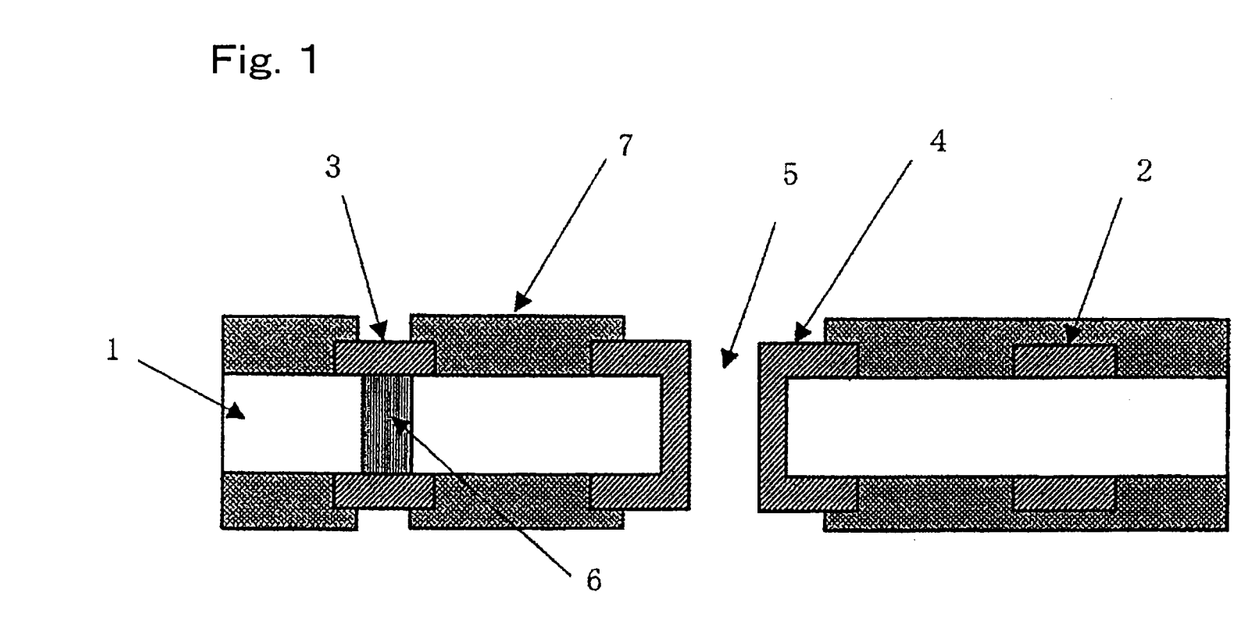

The currently utilized flexible wiring board is shown in a sectional view in FIG. 1. As shown therein, a metal laminated board such as, for example, a copper laminated board for a flexible printed wiring board is subjected to an etching process to provide a structure, in which a coverlay 7 is formed not only protect an electroconductive circuit 2 formed on an insulating layer 1, but also to provide a portion of the metal laminated board with an electrically insulating property, except for a land 4, where electronic component parts such as, for example, semiconductor elements are fixedly mounted, a terminal electrode forming portion 3, a via hole 6 filled with an electroconductive material and a throughhole 5 for conducting between terminal electrodes.

Figure 2:
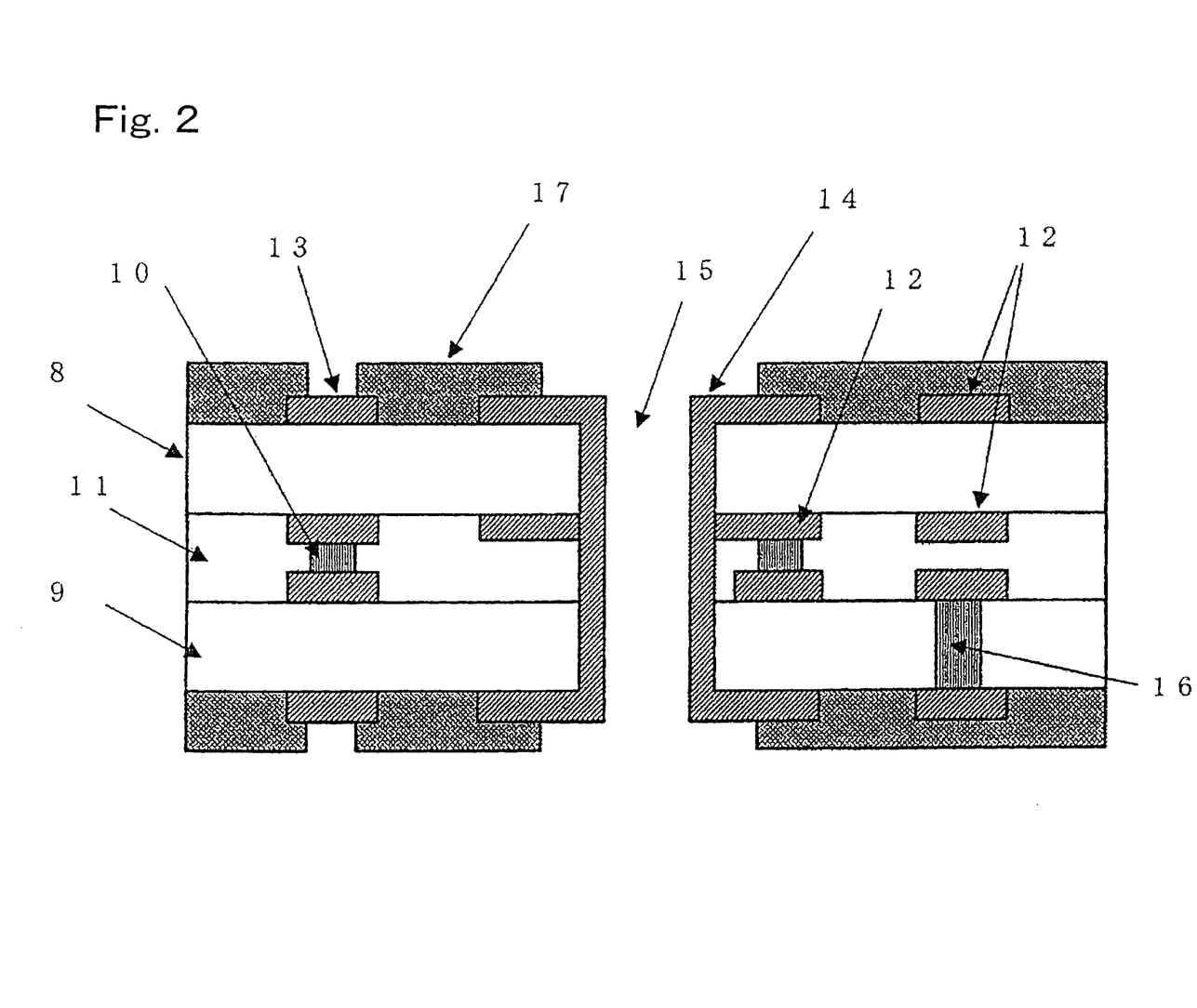
FIG. 2 is a schematic sectional view showing an example of a multilayer wiring board.

Also, a multilayer wiring board is of a structure, in which as shown in a sectional view in FIG. 2, electroconductive circuits 12 on each of wiring layers including a plurality of insulating layers 8, 9 and 11 are connected with each other through a throughhole 15 and via holes 10 and 16 and in which as is the case with the previously described printed wiring board, a coverlay 17 protects an electroconductive circuit 12 on the outermost layer and, at the same time, is provided for the purpose of imparting an electrically insulating property to a portion of the multilayer wiring board excluding a land 14, where electronic component parts such as, for example, semiconductor elements are fixedly mounted, and a terminal electrode forming portion 13.

Figure 3:
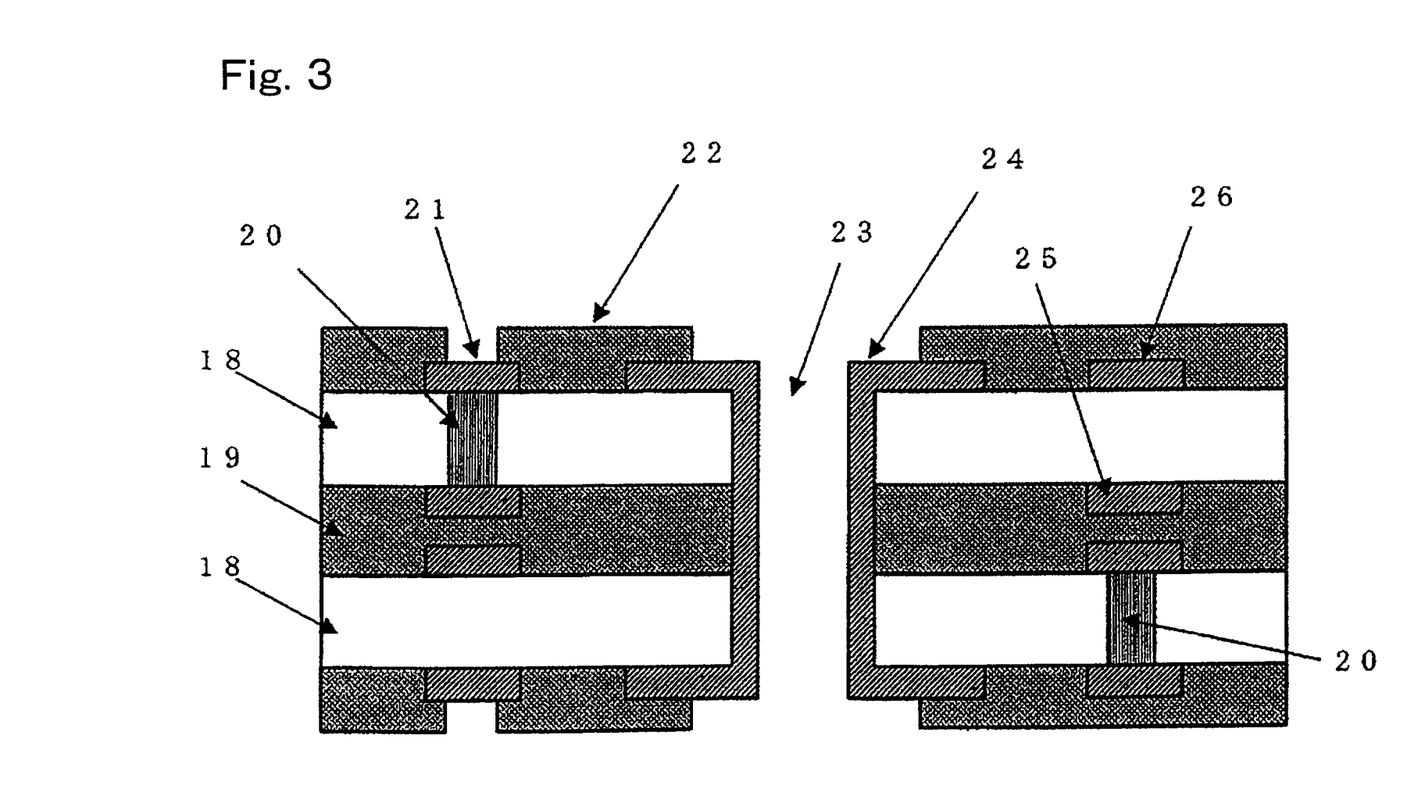
FIG. 3 is a schematic sectional view showing another example of the multilayer wiring board.

Also, circuit constructions 18 to 26 (where reference numerals 18 and 19 represent insulating layers, reference numeral 20 represents a via hole, reference numeral 21 represents an electroconductive circuit, reference numeral 23 represents a throughhole, reference numeral 24 represents a land, and reference numerals 25 and 26 represent electroconductive circuits) utilizes a coverlay 22 for the identical purpose.

In the meantime, in order to enhance the functionality and the reliability of the wiring board itself, the use has been suggested in, for example, the Japanese Laid-open Patent Publication No. H05-42603, of a thermotropic liquid crystal polymer as an insulative substrate material. This thermotropic liquid crystal polymer is considered as a material excellent not only in reliability in respect of securing performances such as, for example, low hygroscopic property, heat resistance and chemical resistance, but also in electric characteristic, in which the dielectric dissipation factor and the dielectric constant particularly at a high frequency region are low and transmission signals can be transmitted at high speeds and in large capacity.

According to the foregoing first mentioned publication, it is described that when the thermotropic liquid crystal polymer and a metallic foil are hot pressed together at a temperature within the range of a value lower by 80° C. than the melting point to a value lower by 5° C. than the melting point, a homogeneous laminated body, in which the mechanical strength of a film layer and the interlayer exfoliation strength between the film layer and the metallic foil layer are both high can be obtained at a high productivity. The temperature at which the hot pressing is carried out between the thermotropic liquid crystal polymer and the metallic foil in the manner described above is described as determined on the basis of the melting point.

Also, the Japanese Laid-open Patent Publication No. 2001-244630, for example, discloses formation of a multilayer wiring board by hot pressing a thermotropic liquid crystal polymer film, having a high heat resistance, and a metallic sheet together by means of a hot press roll, forming wired circuits on the metallic sheet to provide a wiring board, and again hot pressing to laminate the resultant wiring board together with a thermotropic liquid crystal polymer, having a melting point lower than the melting point of the first mentioned thermotropic liquid crystal polymer. The hot press roll employed in the practice of the method disclosed in this second mentioned publication has a preferable surface temperature selected to be lower by a value within the range of 50 to 5° C. than the melting point of the second mentioned thermotropic liquid crystal polymer, that is, the thermotropic liquid crystal polymer having the lower melting point. Even in this case, the temperature at which the thermotropic liquid crystal polymer and the metallic sheet and the wiring board material are pressed together is determined on the basis of the melting point.

As discussed hereinabove, since the thermotropic liquid crystal polymer is excellent in performance such as, for example, low hygroscopic property, heat resistance and chemical resistance and, also, in electrical property, the thermotropic liquid crystal polymer has come to be used as a material for the wiring board. However, in the method in which the thermotropic liquid crystal polymer is laminated on the wiring board material and hot pressed together therewith to provide the wiring board, it has been found problematic in that even through the hot press is carried out at a hot pressing temperature selected on the basis of the melting point, the wiring boards of uniform quality cannot be obtained at all times and, hence, the frequency of occurrence of imperfect products is high.

SUMMARY OF THE INVENTION

In view of the foregoing, the present invention has been devised to substantially eliminate the problems and inconveniences inherent in the prior art wiring board as discussed above and has for its primary object to provide a method of making wiring boards of an uniform quality at a high yield, in which a thermotropic liquid crystal polymer having an excellent low hygroscopic property, heat resistance, chemical resistance, electrical property and hot press workability is employed.

Another important object of the present invention is to provide a thermotropic liquid crystal polymer film that can be employed in the practice of the wiring board making method of a kind referred to above.

The inventors of the present invention have conducted extensive studies to identify a cause of change in dimension and shape of an opening, defined in a predetermined region of a thermotropic liquid crystal polymer film, which would occur when such thermotropic liquid crystal polymer film is hot pressed against an electroconductive circuit that is arranged on the outermost layer of the wiring board. As a result thereof, it has been found that the melting point of the thermotropic liquid crystal polymer employed does not constitute such cause. It has also been found that although the hot pressing temperature had hitherto been selected on the basis of the melting point of the thermotropic liquid crystal polymer to be a value lower than such melting point, such selection has come to be considered insufficient for securement of products of a uniform quality at all times. While the hot pressing is carried out at a particular temperature at one point on the abrupt change that is taking place in the polymer, transforming from a solid state to a completely liquid state, the condition during this transformation process is not uniform possibly because the quality changes with change in polymer lot and/or film lot, and the inventors of the present invention have found that even when the melting point remains the same, the use of the same hot press temperature would result in good-for-nothing.

In view of the foregoing, the inventors of the present invention have come to realize that in order to enable a more stabilized operation than experienced conventionally to be accomplished, the viscosity and the elasticity of the thermotropic liquid crystal polymer have to be controlled. The present invention is based on such finding the inventors have acquired as a result of the extensive studies discussed above.

More specifically, the present invention provides a method of making a wiring board, which includes laminating a thermotropic liquid crystal polymer film on a wiring board material having one layer, containing an electroconductive circuit, exposed, and hot pressing them together to provide the wiring board. In accordance with the present invention, the wiring board making method referred to above is characterized in that with respect to a thermotropic liquid crystal polymer used to form the thermotropic liquid crystal polymer film, the viscoelastic characteristic is measured at a low frequency within a laminating temperature region, a temperature is then selected, at which the previously described characteristic value falls within a predetermined range and the hot pressing referred to above is carried out at such selected temperature.

In the practice of the present invention, for the measurement of the viscoelastic characteristic, an apparent melt viscosity is preferably measured and this apparent melt viscosity is preferably measured at a low frequency of 1 Hz. Also, the laminating temperature region is preferably within the range of 240 to 350° C. In addition, the hot pressing is preferably carried out at a temperature, at which a measured value of the apparent melt viscosity falls within the range of $1 \times 10^4$ to $2 \times 10^5$ Pa-s. The measurement of the apparent melt viscosity has to be carried out on a lot-by-lot basis of the film in order for the wiring board of a stabilized quality to be obtained at a high yield.

In a preferred embodiment of the present invention, the apparent melt viscosity may be adjusted by means of a heating process applied to the thermotropic liquid crystal polymer film. In such case, the heating process is preferably carried out at either a temperature equal to or higher than the melting point of the liquid crystal polymer forming the thermotropic liquid crystal polymer film or a temperature within the range of a value lower by 20° C. than the melting point to a value equal to the melting point. More preferably, a base material polymer constituting the wiring board material may be a thermotropic liquid crystal polymer; a polymer constituting the thermotropic liquid crystal polymer film covering the wiring board may be so selected as to have an apparent melt viscosity lower than the apparent melt viscosity of the thermotropic liquid crystal polymer constituting the wiring board material; and the thermotropic liquid crystal polymer film referred to above may be a laminated film having at least two layers, may have a measured value of the apparent melt viscosity of the thermotropic liquid crystal polymer forming a film of one of the layers adjoining the wiring board material, which is lower than that of the apparent melt viscosity of the thermotropic liquid crystal polymer constituting a film of the other of the layers, and may have an apparent melt viscosity within the range referred to hereinabove.

The present invention also provides a wiring board that is manufactured through a process, in which when the thermotropic liquid crystal polymer film is laminated to cover the wiring board material having one of the layers, including an electroconductive circuit, exposed to the outside, the viscoelastic characteristic of the thermotropic liquid crystal polymer forming the film referred to above is measured at a low frequency within a laminating temperature region, a temperature is then selected, at which the previously described characteristic value falls within a predetermined range, and the hot pressing is carried out at such selected temperature.

The present invention furthermore provides a thermotropic liquid crystal polymer film that is used to cover the wiring board material and has a viscoelastic characteristic value adjusted so as to fall within a predetermined range and, preferably, within a predetermined range while the segment orientation ratio (SOR) in a machine direction of the film referred to above is within the range of 1.00 to 1.15.

In the practice of the present invention, the thermotropic liquid crystal polymer film that is used to cover the wiring board material is preferably in the form of a thermotropic liquid crystal polymer film having a coefficient of linear expansion in a direction parallel to a film surface that is substantially equal to a coefficient of linear expansion of the wiring board material, which has one of the layers, including an electroconductive circuit, exposed to the outside, in a direction parallel to the plane of such wiring board; and/or in the form of an thermotropic liquid crystal polymer film, which when exposed to a temperature atmosphere of 260° C. for 30 minutes under an unstressed condition, exhibits a rate of change in dimension which is equal to or lower than 0.05%; and/or in the form of a thermotropic liquid crystal polymer film having a tensile elasticity equal to or higher than 3 GPa in a machine direction of the film and also in a direction perpendicular thereto.

In preferred embodiments of the present invention, the thermotropic liquid crystal polymer film that is to be laminated on the wiring board material having one of the layers, including the electroconductive circuit, exposed to the outside may be in the form of a film and one major surface of the film on which the wiring board material is held in contact therewith, may be roughed. Alternatively, the thermotropic liquid crystal polymer film that is to be laminated on the wiring board material having one of the layers, including the electroconductive circuit, exposed to the outside may be in the form of a film and one major surface of the film, on which the wiring board material is held in contact therewith, may be treated with ionization radiation. Again alternatively therewith or in combination therewith, the thermotropic liquid crystal polymer film referred to above may be in the form of a film having a perforation defined therein for allowing a predetermined site of the electroconductive circuit to be exposed.

According to the present invention, the wiring board making method of the present invention makes use of the thermotropic liquid crystal polymer having an excellent low hygroscopic property, heat resistance, chemical resistance, electric property and a hot pressing processability, selects a temperature, at which the viscoelastic characteristic value of the thermotropic liquid crystal polymer falls within a predetermined range and then allows the thermotropic liquid crystal polymer to be laminated on the wiring board material at such selected temperature. Accordingly, wiring boards such as, for example, flexible wiring board or multilayer wiring board of a uniform quality can be obtained at a high yield.

Also, according to the present invention, the thermotropic liquid crystal polymer can be obtained, of which viscoelastic characteristic value is adjusted so as to fall within a predetermined range at a predetermined laminating temperature in order to manufacture the wiring board of a uniform quality at a high yield.

BRIEF DESCRIPTION OF THE DRAWINGS

FIG. 1 is a schematic sectional view showing an example of a flexible wiring board such as, for example, a copper laminated plate or the like;

DETAILED DESCRIPTION OF THE EMBODIMENTS

The thermotropic liquid crystal polymer employed in the present invention is not particularly limited to a specific one, but any known thermotropic liquid crystal polyesters and thermotropic liquid crystal polyester amides, which are of the following type shown in Table (5), which are derived from compounds classified in the following four types shown in Tables (1) to (4), and their derivatives, can be employed in the practice of the present invention. It is, however, to be noted that in order to obtain a polymer that can form an optically anisotropic melt phase, a proper range does nevertheless exist in combination of the various raw material compounds. Also, the film may be added with one or more additives such as, for example, a lubricant, an oxidization inhibitor and/or a filling agent.

Aromatic or aliphatic dihydroxy compounds, representative examples of which are shown in Table 1 below.

TABLE 1

Chemical formulas of the representative examples of aromatic or aliphatic dihydroxy compounds (X: hydrogen atom or halogen atom, or lower alky, phenyl or like groups)

TABLE 1-continued

Chemical formulas of the representative examples of aromatic or aliphatic dihydroxy compounds (Y: —O—, —CH$_2$—, —S— or like groups)

HO(CH$_2$)$n$OH
($n$: an integer from 2 to 12)

Aromatic or aliphatic dicarboxylic acids, representative examples of which are shown in Table 2 below.

TABLE 2

Chemical formulas of the representative examples of aromatic or aliphatic dicarboxylic acids HOOC(CH$_2$)$n$COOH
($n$: an integer from 2 to 12)

Aromatic hydroxycarboxylic acids, representative examples of which are shown in Table 3 below.

TABLE 3

Chemical formulas of the representative examples of aromatic hydroxycarboxylic acids (X: hydrogen atom or halogen atom, or lower alky, phenyl or like groups)

Aromatic diamines, aromatic hydroxyamines and aromatic aminocarboxylic acids, representative examples of which are shown in Table 4 below.

TABLE 4

Chemical formulas of representative examples aromatic diamines, aromatic hydroxyamines and aromatic aminocarboxylic acids Representative examples of the thermotropic liquid crystal polymer prepared from any of those starting material compounds include copolymers having such structural units as shown in Table 5 below.

TABLE 5

Examples of Thermotropic Liquid Crystal Polymers copolymer

TABLE 5-continued

Examples of Thermotropic Liquid Crystal Polymers copolymer copolymer copolymer (Y: —O—, —CH$_2$—, —S— or like groups)
copolymer Also, the thermotropic liquid crystal polymer that can be employed in the practice of the present invention is preferably of a kind having a melting point, which may be determined independent of the viscosity and elasticity of the film. However, in order to secure the desired heat resistance and workability of the film, the melting point of the thermotropic liquid crystal polymer is preferably within the range of 200 to 400° C. and, more preferably within the range of 250 to about 350° C., but in terms of the manufacture of the film, such melting point is preferably relatively low. Accordingly, where the high heat resistance and melting point are required, the desired heat resistance and melting point can be increased when the film once obtained is heat treated. To explain an exemplary condition of the heat treatment by way of example, even when the film once obtained has a melting point of 283° C., heating of the film at 260° C. for five hours can result in the melting point of 320° C. Such heat treatment is well known in the art and reference may be had to U.S. Pat. No. 6,274,242 (=Japanese Laid-open Patent Publication No. 2000-44797), which is in possession of the assignee of the present invention and the disclosure of which is herein incorporated by reference.

The thermotropic liquid crystal polymer film that can be used in the present invention can be obtained by extrusion-molding of the thermotropic liquid crystal polymer referred to above. At this time, although any known extrusion molding method may be employed, any of the known T-die film forming and stretching method, laminate stretching method, inflation method and the like is industrially advantageous. Particularly with the inflation method, stresses can be applied not only in a direction of the mechanical axis of the film (which direction is hereinafter referred to as "MD direction"), but also in a direction perpendicular to the MD direction (which direction is hereinafter referred to as "TD direction") and, therefore, it is possible to obtain the film, of which mechanical properties and thermal characteristics in both of the MD direction and the TD direction are well balanced with each other. Such a film making method is disclosed in the Japanese Laid-open Patent Publication No. 2000-326405, applied for patent in the name of the assignee of the present invention. When the thermotropic liquid crystal polymer film that can be obtained through the above described film making method is to be laminated to cover the wiring board material having one of the layers, including an electroconductive circuit, exposed to the outside, the viscoelastic characteristic of the thermotropic liquid crystal polymer forming the film referred to above is measured at a low frequency within a laminating temperature region, a temperature is then selected, at which the previously described viscoelastic characteristic value falls within a predetermined range, and the hot pressing is carried out at such selected temperature to thereby provide the wiring board. The measurement of the viscoelastic characteristic is preferably a measurement of an apparent melt viscosity and is preferably carried out on a lot-by-lot basis of the film.

The thermotropic liquid crystal polymer film obtained by the above described film making method in accordance with the present invention has an apparent melt viscosity, which is obtained at a frequency of 1 Hz at the laminating temperature of 240 to 350° C., which viscosity is preferably within the range of $1 \times 10^4$ to $2 \times 10^5$ Pa·s. The thermotropic liquid crystal polymer film, of which apparent melt viscosity obtained at a frequency of 1 Hz at the specific laminating temperature of 240 to 350° C. falls within the above described range, can be suitably used as a coverlay since a change in dimension and shape of an opening, or the entirety thereof is small when such thermotropic liquid crystal polymer film is hot pressed together with an electroconductive circuit arranged on the outermost layer of the wiring board material after forming the opening in a predetermined region of such a film or without forming the opening. Where the apparent melt viscosity obtained at the frequency of 1 Hz at that laminating temperature is higher than $2 \times 10^5$ Pa·s, the adhesive strength with the outermost layer of the wiring board material and the electroconductive circuit disposed thereon will be insufficient and the resultant wiring board will not be reliable in securing such performances as the heat resistance, the vapor barrier property and the chemical resistance. Also, in such case, if the laminating temperature is increased to increase the adhesive strength referred to above, problems will arise in that an insulating layer forming a part of the wiring board will be thermally deteriorated and the wiring board including the electroconductive circuit can no longer retain its shape. On the other hand, where the apparent melt viscosity obtained at the frequency of 1 Hz at that laminating temperature is lower than $1 \times 10^4$ Pa·s, the adhesive strength referred to above may increase, but the thermotropic liquid crystal polymer may fluidize considerably and, therefore, the dimension and shape of the opening in the coverlay and of the entirety thereof may fail to satisfy predetermined design values.

The temperature at which the wiring board material and the thermotropic liquid crystal polymer film are laminated together is preferably of a value sufficient to allow the apparent melt viscosity of the thermotropic liquid crystal polymer film, obtained at the frequency of 1 Hz, to fall within the range of $1 \times 10^4$ to $2 \times 10^5$ Pa·s. Although a method has hitherto been employed, in which the laminating temperature is determined on the basis of the melting point of the film used, problems associated with indefiniteness, which would arise when the melting point of the film is used as a basis for determination of the laminating temperature, have been encountered in that there is little cases, in which the melting point of the thermotropic liquid crystal polymer measured by the use of a differential scanning calorimeter (hereinafter referred to as "DSC") exhibits an endothermic peak definitely, and even if there is such a case, such melting point tends to exhibit a small endothermic peak or no endothermic peak will not appear after the heat treatment. In the practice of the present invention, however, the laminating temperature is controlled not on the basis of the melting point of the liquid crystal polymer, but the apparent melt viscosity at the laminating temperature is controlled to enable a laminated board, aimed at by the present invention, to be obtained at a high yield.

As a method of rendering the apparent melt viscosity at the laminating temperature with the frequency of 1 Hz to be within the range of $1 \times 10^4$ to $2 \times 10^5$ Pa·s, any of a method of adjusting the molecular amount of a raw resin and a method, in which after the thermotropic liquid crystal polymer film has been laminated on a support body of a high heat resistance such as, for example, a metallic foil, the resultant laminate is heat treated under an activated atmosphere such as, for example, an atmosphere or under an inert atmosphere such as, for example, nitrogen can be employed. More specifically, as a method of adjusting the melting point of the film and the apparent melt viscosity independently from each other, heat treatment of the film so obtained at a temperature higher than the melting point of the film or at a temperature ranging from a value equal to the melting point of the film to a value lower by 20° C. than the melting point of such film is effective to adjust only the apparent melt viscosity even though the melting point remains the same. Considering the foregoing, in the practice of the present invention, the laminating temperature of the thermotropic liquid crystal polymer film is so selected as to be within the range of 240 to 350° C., preferably 250 to 330° C., and more preferably 260 to 320° C.

The thermotropic liquid crystal polymer employed in the practice of the present invention may be of a single layer structure. However, where a high heat resistance is required, a laminate including a first thermotropic liquid crystal polymer, of which apparent melt viscosity, obtained at the frequency of 1 Hz at the laminating temperature within the range of 240 to 350° C., falls within the range of $1 \times 10^4$ to $2 \times 10^5$ Pa-s, and a second thermotropic liquid crystal polymer, of which apparent melt viscosity, obtained at the frequency of 1 Hz at the laminating temperature within the range of 240 to 350° C., is equal to or higher than $3 \times 10^5$ Pa-s, may be employed. Where this laminate is employed, a layer of the first thermotropic liquid crystal polymer may be laminated on a wiring board material having one layer, including an electroconductive circuit, exposed. If the melt viscosity is lower than $3 \times 10^5$ Pa-s, such melt viscosity nears to that of the first thermotropic liquid crystal polymer and, therefore, it may occur that deformation and/or flow of resin may take place when it is laminated on the wiring board material. On the other hand, if the melt viscosity exceeds the lowest limit of $1 \times 10^7$ Pa-s, the wired circuit may be deformed during the lamination on the wiring board material and/or displacement in position may occur undesirably. The laminate including the first thermotropic liquid crystal polymer and the second thermotropic liquid crystal polymer discussed above can be manufactured when respective films of those first and second thermotropic liquid crystal polymers are stacked one above the other and the resultant stack is subsequently hot pressed together while a temperature and a pressure, both required to bond those two films to each other, are applied thereto.

In order to manufacture the laminate with the above described method, any suitable device such as, for example, a flat plate press or a continuous roll press can be employed. Of them, the use of the continuous roll press is preferred because of a high productivity. It is, however, to be noted that in order to prevent the thermotropic liquid crystal polymer film from sticking to a hot plate or a heating roll of the above described press, a releasing material may be sandwiched between upper and lower surfaces of the thermotropic liquid crystal polymer films that are stacked one above the other.

The laminate made up of the first thermotropic liquid crystal polymer and the second thermotropic liquid crystal polymer can also be manufactured by simultaneously extruding those two thermotropic liquid crystal polymers in a melt state through the same die. For the manufacture of the laminate with this method, any of a T-die forming machine and an inflation forming machine can be suitably employed, but the films made by the use of the inflation forming machine can exhibit balanced mechanical and thermal characteristics in both of the MD and TD directions and, accordingly, the use of the inflation forming machine is rather suitable.

The thermotropic liquid crystal polymer film has a region, in which a solid state and a melt state coexist at the laminating temperature at which such thermotropic liquid crystal polymer film is laminated on the wiring board material. In view of this, it has been found that with the method using a melt flow rate testing machine stipulated in JIS K7210 Test Method for the measurement of the viscosity of a complete liquid state, or with the flow characteristic testing method with the use of a capillary rheometer stipulated in JIS K7199 Test Method for measuring a viscosity of the thermotropic crystal liquid polymer from the beginning and during fluidization, the required characteristic of the thermotropic liquid crystal polymer film employed in the practice of the present invention during the lamination cannot be reflected sufficiently.

In view of the foregoing, the inventors of the present invention have conducted a series of studies to clarify detailed viscosity behaviors with the use of rotary rheometer capable of extensively evaluating physicality behaviors ranging from a melt state to a solid state corresponding to a change in the laminating temperature region. As a result, the inventors of the present invention have found that when the thermotropic liquid crystal polymer is sandwiched between a pair of discs and a normal stress of 5 N is then applied, the apparent melt viscosity can be evaluated under a condition of the frequency of 1 Hz.

The measurement frequency at which the apparent melt viscosity is measured at the laminating temperature of 240 to 350° C. in the practice of the present invention is preferably 1 Hz, which is equal to the filling speed at which the film is filled in indentations of copper forming a circuit on the wiring board material or to the pressure applying speed at which pressure is applied during the actual laminating process. It is generally known that the apparent melt viscosity depends considerably on the measurement frequency and, in particular, the melt viscosity of the thermotropic liquid crystal polymer film tends to lower as the frequency becomes high and, in view of the fact that the actual batch lamination (a method in which pressure is applied between hot plates to press) and a roll lamination (a method in which pressure is continuously applied between a pair of hot rolls) involve a low shearing speed during the laminating process (a low frequency), measurement at the frequency of 1 Hz as specified in accordance with the present invention is preferred.

In the practice of the present invention, the molecular orientation ratio (SOR) of the thermotropic liquid crystal polymer film in the MD direction thereof may be determined depending on characteristics of the wiring board material to be covered with such film and/or the purpose for which it is used. However, since the thermotropic liquid crystal polymer film having a molecular orientation ratio (SOR) within the range of 1.00 to 1.15 is a film that can exhibit balanced physical and thermal properties in both of the MD and TD directions, it can be suitably employed as a coverlay. If the molecular orientation ratio (SOR) departs from the above mentioned range, the film tends to be torn in one direction and/or the wiring board laminated with those will be apt to warp enough to result in an undesirable flatness.

The SOR (segment orientation ratio) referred to above represents an index of the degree of molecular orientation of segments constituted by molecules and is a value, in which the thickness of an object is taken into consideration. In this respect, this SOR is quite different from the conventional MOR (molecular orientation ratio).

The molecular orientation ratio (SOR) referred to above can be calculated by the following manner. Using a known microwave molecular orientation measuring machine, the thermotropic liquid crystal polymer film is inserted into a microwave resonant waveguide with its film surface laid perpendicular to the direction of propagation of microwaves, so that the field strength of the microwaves passing through the film (i.e., the microwave permeability) can be measured. Based on this measurement, the m value (a refractive index) is calculated by the following equation:

$$m = (Z_0/\Delta z) \times [1 - v_{max}/v_0]$$

wherein $Z_0$ represents a device constant; $\Delta z$ represents an average thickness of an object; $v_{max}$ represents the frequency at which the maximum microwave permeability can be obtained when the frequency of the microwave is varied; and $v_0$ represents the frequency at which the maximum microwave permeability can be obtained when the average thickness is zero (that is, when no object is present).

Then, the segment orientation ratio (SOR) is calculated by dividing $m_0$ by $m_{90}$ ($m_0/m_{90}$), wherein $m_0$ represents the m value attained when the angle of rotation of the object relative to the direction of oscillation of the microwaves is 0°, that is, when the direction of oscillation of the microwaves coincides with the direction in which molecules of the object are most oriented and the minimum microwave penetration strength is exhibited, and $m_{90}$ represents the m value attained when the angle of rotation of the object relative to the direction of oscillation of the microwaves is 90°.

The coefficient of linear expansion of the thermotropic liquid crystal polymer film, employed in the practice of the present invention, in a direction parallel to the plane thereof is preferably substantially equal to that of the wiring board material that is covered with such film. If the both have a considerably different coefficient of linear expansion, the wiring board may warp after the lamination by means of a hot pressing, during and/or after passage thereof through a solder reflow step, which may in turn lead to an undesirable flatness.

The thermotropic liquid crystal polymer film employed in the practice of the present invention preferably has a rate of change in dimension, which is equal to or lower than 0.05%, when exposed to a heated atmosphere of 260° C. for 30 minutes. If the rate of change in dimension of the thermotropic liquid crystal polymer film is higher than 0.05%, it may occur that the wiring board may warp after the lamination by means of a hot pressing, during and/or after passage thereof through a solder reflow step, accompanied by lowering of the flatness, even though the molecular orientation ratio (SOR) and the coefficient of linear expansion are kept within the respective specific ranges.

The thermotropic liquid crystal polymer film employed in the present invention has a film thickness preferably within the range of 10 to 250 μm. Where the wiring board, in which the thermotropic liquid crystal polymer film is joined as a coverlay, is required to have a particularly high rigidity, either the film thickness is so selected as to be within the range of 100 to 250 μm, or the tensile modulus of the thermotropic liquid crystal polymer film in each of the MD direction thereof and the TD direction is preferably so selected as to be equal to or higher than 3 GPa.

Also, one major surface of the thermotropic liquid crystal polymer film employed in the practice of the present invention, on which such thermotropic liquid crystal polymer film is laminated on one layer of the wiring board material including an electroconductive circuit, exposed is subjected to a surface roughening treatment. Alternatively, such one major surface of the thermotropic liquid crystal polymer film may be treated with an ionization radiation. The thermotropic liquid crystal polymer film having a surface roughened or treated with an ionization radiation is effective in that the bonding strength with the wiring board material can be increased and can therefore be employed advantageously. For the surface roughening treatment, any of etching with a liquid alkaline solution, mechanical grinding with abrasive particulates and sandblasting with finely divided particles can be suitably employed. On the other hand, for the ionization radiation, any of a plasma treatment, a UV radiation and a corona treatment can be suitably employed.

The insulating layer of the wiring board material, on which the thermotropic liquid crystal polymer film is laminated in the practice of the present invention, may be of any suitable material and may not therefore be limited to a specific material. By way of example, such insulating layer may be made of a layer of a polymer such as, for example, a liquid crystal polymer, polyimide resin, epoxy resin, bis-maleimide triazine resin, polyphenylene ether resin, polyether ether ketone resin, polyether imide resin or polyether ketone ketone resin, which may be a base material including a sheet-like fiber reinforcement material such as, for example, a glass cloth impregnated with any of the above polymers. However, if of them the liquid crystal polymer is used as the insulating layer, the wiring board can be obtained which is excellent in reliability in respect of such characteristics as low moisture absorption property, chemical resistance and heat resistance, which has particularly a low dielectric dissipation factor and a low dielectric constant at a high frequency region, which is also excellent in electric characteristic enough to allow the transmission signals to be transmitted at high speeds and to allow it to have an increased capacity and which has a high functionality and a high reliability. Accordingly, the liquid crystal polymer can be suitably employed as the material for the insulating layer.

Since when the thermotropic liquid crystal polymer film employed in the present invention is to be laminated on the wiring board material having one layer, including the electroconductive circuit, exposed, such thermotropic liquid crystal polymer film can be hot pressed together with the wiring board material while an undesirable deformation of the electroconductive circuit and the insulating layer forming a part of the wiring board and a fluidization of the thermotropic liquid crystal polymer film itself are suppressed as much as possible, it may be intervened between a plurality of wiring boards so that it can be used suitably as a bonding layer 19 as shown in FIG. 3.

Hole-forming to expose a predetermined portion of the electroconductive circuit on the thermotropic liquid crystal polymer film employed in the practice of the present invention is required particularly where electric connection between electronic component parts that are surface mounted on the electroconductive circuit and/or connector connection in the case where wiring boards are to be connected with each other are required. Accordingly, such hole-forming may be carried out depending on the size and arrangement of the electroconductive circuit and may be accomplished by means of a blanking with a die, shaping with a laser beam or etching with a chemical solution can be employed prior to lamination of the electroconductive circuit.

Hereinafter, the present invention will be demonstrated by way of specific examples which are not intended to limit the scope of the present invention, but are shown only for the purpose of illustration. It is to be noted that in all of those specific examples, the melting point of the thermotropic liquid crystal polymer film, the apparent melt viscosity thereof, the coefficient of linear expansion thereof, the bondability of the laminate, the rate of change in dimension, the appearance and the resin flow resistance are measured by the following individual methods.

Melting Point:

The melting point was obtained from the thermal behavior of the film, which was observed when a differential scanning calorimeter was used. In other words, after the temperature of the test film had been raised at a rate of 10° C./min to completely melt the film, the molten product was rapidly cooled to 50° C. at a rate of 50° C./min and then the position of the heat absorption peak appearing when the temperature thereof was raised again at a rate of 10° C./min was recorded as the melting point of the film.

Apparent Melt Viscosity Pa-s:

Using a commercially available rotary rheometer, "AR200", available from Texas Instruments Japan, the apparent melt viscosity was determined at the frequency of 1 Hz at the temperature of 240 to 350° C. (laminating temperature) and at a normal stress of 5 N with a programming rate of 3° C./min.

Film Linear Expansion Coefficient cm/cm/° C.:

The coefficient α of linear expansion represents a coefficient of expansion, which is exhibited by a film when the latter is heated from room temperature to a temperature in the vicinity of the temperature of thermal deformation of such film at a predetermined programming rate, divided by a temperature difference and can be calculated in the following manner.

In the first place, using any known thermomechanical analyzing apparatus, the amount of thermal expansion of a sample of film, cut to an oblong shape, is measured in such a manner that the sample of the film having one end fixed and the other end applied with a tensile load, is heated at a predetermined programming speed. The coefficient α of linear expansion can be calculated by the following formula, in which the length of the film in a direction conforming to the direction in which the tensile load is applied is expressed by $L_0$ (mm), the length of the film when heated is expressed by $L_1$ (mm), the temperature is expressed by $T_2$ (° C.) and the room temperature is expressed by $T_1$ (° C.):

$$\alpha=[(L_1-L_0)/(T_2-T_1)]/L_0 (\times 10^{-6} cm/cm/° C.)$$

It is to be noted that in the illustrated embodiment, the coefficient α of linear expansion was calculated with $L_0$, $T_2$, $T_1$ and tensile load set to 20 mm, 150° C., 25° C. and 1 g, respectively.

Rate of Change in Film Dimension %:

This rate of change in dimension of the film was measured based on IPC-TM-6502.2.4 Test Method.

Film Tensile Modulus GPa:

This modulus of tensile elasticity of the film was measured based on ASTM D882 Test Method.

Appearance and Resin Flow Resistance of Laminate:

(1) Appearance:

The appearance of the thermotropic liquid crystal polymer film is deemed to be acceptable (as indicated by O in Table 6 below) if none of a warp of the laminate, a flow of resin from ends, exfoliation and blistering is found, after the thermotropic liquid crystal polymer film has been laminated on the wiring board material, but to be rejected (as indicated by X in Table 6 below) if a defective portion is found.

(2) Resin Flow Resistance:

Acceptable is labeled (as indicated by O in Table 6 below) when a hole of 5 mm in diameter was formed in the thermotropic liquid crystal polymer film and, after it has been laminated on the wiring board material, no change is found in diameter of the hole, but rejected is labeled (as indicated by X in Table 6 below) when change is found as a result of the resin flow.

Bondability of Laminate:

A test piece, 1 cm in width, was prepared from the laminate, having its film layer fixed between flat plates by the use of a double sided adhesive tape, and was then measured according to JIS C5016 Test Method as to the bonding strength exhibited when the film layer was exfoliated at a speed of 50 mm/min by means of a 180° method. When the bonding strength is equal to or higher than 0.5 kg/cm, it was deemed to be acceptable (as indicated by O in Table 6 below), but when the bonding strength is lower than 0.5 kg/cm, it was deemed to be rejected (as indicated by X in Table 6 below).

Yield:

With respect to Example 1 and Comparative Examples 4 and 5, the thermotropic liquid crystal polymer films of different five lots, but having the same melting point were laminated on the wiring board material on the same conditions respectively and the frequency of coincidence of the above described evaluation values was determined. With respect to the other Examples and Comparative Examples, the frequency of coincidence of the above described evaluation values for one lot was determined.

Reference Example 1

A thermotropic liquid crystal polyester, which is a copolymer of p-hydroxybenzoic acid and 6-hydroxy-2-naphthoic acid and which has a melting point of 280° C., was extruded in a melt phase and was inflation molded under a inflation molding condition, in which the stretching ratio in TD and MD directions was controlled to thereby provide a thermotropic liquid crystal polymer film having a film thickness of 25 μm, a melting point of 280° C., a segment orientation ratio (SOR) of 1.03, a coefficient of linear expansion of $-5 \times 10^{-6}$ cm/cm/° C., a rate of dimensional change of 0.03% and a tensile modulus of 8 GPa. The resultant film was heat treated at 260° C. for five different lengths of time to provide the films of the same physical properties as those described above. Those thermotropic liquid crystal polymer films are hereinafter identified by A1 to A5, respectively.

Reference Example 2

The thermotropic liquid crystal polymer film A1 obtained under Reference Example 1 above was stacked with an aluminum foil of 30 μm in thickness coated with a mold-releasing agent and was then passed under a pressure of 20 kg/cm² between a heating roll, heated to 260° C., and a heat resistant rubber roll to allow it to be hot pressed together with the aluminum foil. After the hot pressing, the film A1 and the aluminum foil were heat treated for 30 seconds within a heat treatment furnace heated to 280° C. Thereafter, the aluminum foil was peeled off, leaving a film having a film thickness of 25 μm, a melting point of 280° C., a segment orientation ratio (SOR) of 1.01, a coefficient of linear expansion of $18 \times 10^{-6}$ cm/cm/° C., a rate of dimensional change of 0.02% and a modulus of tensile elasticity of 3 GPa. This thermotropic liquid crystal polymer film is hereinafter referred to as B1.

Reference Example 3

A thermotropic liquid crystal polyester, which is a copolymer of p-hydroxybenzoic acid and 6-hydroxy-2-naphthoic acid and which has a melting point of 325° C., was extruded in a melt phase and was inflation molded under a inflation molding condition, in which the stretching ratio in TD and MD directions was controlled to thereby provide a thermotropic liquid crystal polymer film having a film thickness of 25 μm, a melting point of 325° C., a segment orientation ratio (SOR) of 1.02, a coefficient of linear expansion of $-4 \times 10^{-6}$ cm/cm/° C., a rate of dimensional change of 0.02% and a tensile modulus of 6 GPa. The resultant film was heat treated at 260° C. for five different lengths of time to provide the films of the same physical properties as those described above. Those thermotropic liquid crystal polymer films are hereinafter identified by C1 to C5, respectively.

Reference Example 4

The thermotropic liquid crystal polymer film C1 obtained under Reference Example 3 above was stacked with an aluminum foil of 30 μm in thickness coated with a mold releasing agent and was then passed under a pressure of 20 kg/cm² between a heating roll, heated to 305° C., and a heat resistant rubber roll to allow it to be hot pressed together with the aluminum foil. After the hot pressing, the film C1 and the aluminum foil were heat treated for 30 seconds within a heat treatment furnace heated to 325° C. Thereafter, the aluminum foil was peeled off, leaving a film having a film thickness of 25 μm, a melting point of 325° C., a segment orientation ratio (SOR) of 1.01, a coefficient of linear expansion of $18 \times 10^{-6}$ cm/cm/° C., a rate of dimensional change of 0.03% and a tensile modulus of 4 GPa. This thermotropic liquid crystal polymer film is hereinafter referred to as D1.

Reference Example 5

An electrolytic copper foil of 18 μm in thickness was pressed to opposite surface of the thermotropic liquid crystal polymer film D1, obtained under Reference Example 4 above, under 4 MPa at 310° C. for 10 minutes and the copper foil was etched off to form a grid pattern of circuit, 100 μm in line-width and 100 μm in spacing between the lines, on each of the opposite surfaces, to thereby provide wiring board materials that are used in the subsequently described Examples 1 to 4 and Comparative Examples 1 to 5.

Reference Example 6

The film B1 obtained under Reference Example 2 above was heat treated for 5 hours under the nitrogen atmosphere of 260° C. in temperature to provide a film having a melting point of 310° C., a segment orientation ratio (SOR) of 1.01, a coefficient of linear expansion of $18 \times 10^{-6}$ cm/cm/° C., a rate of dimensional change of 0.01% and a tensile modulus of 3 GPa. This thermotropic liquid crystal polymer film is hereinafter referred to as E1.

Example 1

After the respective apparent melt viscosities of the films A1 to A5 obtained under Reference Example 1 above had been measured, two films each having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was so set that the apparent melt viscosity might fall within the range of $1 \times 10^4$ to $2 \times 10^5$ Pa-s, the film and the wiring board material were laminated together under a vacuum condition by the application of a pressure of 4 MPa for 10 minutes.

Example 2

Two films each being the film B1 obtained under Reference Example 2 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 265° C., the film and the wiring board material were laminated together under a vacuum condition by the application of a pressure of 4 MPa for 10 minutes. The apparent melt viscosity of the film A was $2 \times 10^5$ Pa-s and the apparent melt viscosity of the wiring board material polymer was $6 \times 10^5$ Pa-s at the laminating temperature of 265° C.

Example 3

Two films each being the film C1 obtained under Reference Example 3 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 295° C., the film and the wiring board material were laminated together under a vacuum condition by the application of a pressure of 4 MPa for 10 minutes. The apparent melt viscosity of the film A was $1 \times 10^5$ Pa-s and the apparent melt viscosity of the wiring board material polymer was $4 \times 10^5$ Pa-s at the laminating temperature of 295° C.

Example 4

Two films each being the film E1 obtained under Reference Example 6 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 310° C., the film and the wiring board material were laminated together under a vacuum condition by the application of a pressure of 4 MPa for 10 minutes. The apparent melt viscosity of the film A was $1 \times 10^5$ Pa-s and the apparent melt viscosity of the wiring board material polymer was $2 \times 10^5$ Pa-s at the laminating temperature of 310° C.

Comparative Example 1

Two films each being the film A1 obtained under Reference Example 1 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 300° C., the film and the wiring board material were laminated together under a vacuum condition by the application of a pressure of 4 MPa for 10 minutes. The apparent melt viscosity of the film A1 was $4 \times 10^5$ Pa-s and the apparent melt viscosity of the wiring board material polymer was $3 \times 10^5$ Pa-s at the laminating temperature of 300° C. The laminate so obtained was found exhibiting a departure of the dimensions and shape of the opening and those of the entirety from a design value because the apparent melt viscosity of the film A1 is low and the thermotropic liquid crystal polymer forming the film A1 fluidized considerably.

Comparative Example 2

Two films each being the film B1 obtained under Reference Example 2 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 250° C., the film and the wiring board material were laminated together under a vacuum condition by the application of a pressure of 4 MPa for 10 minutes. The apparent melt viscosity of the film B1 was $6\times10^5$ Pa-s and the apparent melt viscosity of the wiring board material polymer was $7\times10^5$ Pa-s at the laminating temperature of 250° C. The laminate so obtained was found exhibiting an insufficient heat resistance, vapor barrier property and chemical resistance because the apparent melt viscosity of the film B1 was high and the bondability with the outermost layer of the wiring board material and the electroconductive circuit disposed thereon was insufficient.

Comparative Example 3

Two films each being the film C1 obtained under Reference Example 3 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 330° C., the film and the wiring board material were laminated together under a vacuum condition by the application of a pressure of 4 MPa for 10 minutes. The apparent melt viscosity of the film C1 was $8\times10^3$ Pa-s and the apparent melt viscosity of the wiring board material was $1\times10^5$ Pa-s at the laminating temperature of 330° C. The laminate so obtained was found exhibiting a departure of the dimensions and shape of the opening and those of the entirety from a design value because the apparent melt viscosity of the film C1 is low.

Comparative Example 4

Two films each being the film A1 to A5 obtained under Reference Example 1 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 275° C., the film and the wiring board material were laminated together under a vacuum condition by the application of a pressure of 4 MPa for 10 minutes. The apparent melt viscosities of the films A1 to A5 were $4\times10^4$ Pa-s, $7\times10^3$ Pa-s, $2\times10^5$ Pa-s, $3\times10^5$ Pa-s and $6\times10^4$ Pa-s, respectively, and the apparent melt viscosity of the wiring board material was $5\times10^5$ Pa-s at the laminating temperature of 275° C.

Comparative Example 5

Two films each being the film C1 to C5 obtained under Reference Example 3 above and having a hole of 5 mm in diameter defined at five random locations thereof were prepared and disposed on respective sides of the wiring board material obtained under Reference Example 5 above; a polyimide film of 25 μm in thickness was overlapped on respective sides as a mold releasing agent; and, while the temperature of a hot plate of a vacuum hot press was set to 295° C., the film and the wiring board material were laminated together under a vacuum condition by the application of a pressure of 4 MPa for 10 minutes. The apparent melt viscosities of the films C1 to C5 were $1\times10^5$ Pa-s, $4\times10^4$ Pa-s, $3\times10^5$ Pa-s, $7\times10^4$ Pa-s and $8\times10^3$ Pa-s, respectively, and the apparent melt viscosity of the wiring board material was $4\times10^5$ Pa-s at the laminating temperature of 295° C.

As shown in Table 6, the laminate according to any one of Examples 1 to 4 discussed above is of a structure, in which the apparent melt viscosity of the film at the frequency of 1 Hz is laminated at a temperature falling within the predetermined range as defined by the present invention and, therefore, the appearance, the resin flow resistance and the bondability after the lamination were found excellent. In particular, since in Example 1 above, the laminate was manufactured after the measurement on a lot-by-lot basis while the temperature of the hot plate of the vacuum hot press had been set to such a value as to enable the apparent melt viscosity to fall within the range of $1\times10^4$ to $2\times10^5$ Pa-s, no variation in quality was found among the lots.

On the other hand, the laminate according to any one of Comparative Examples 1 to 3 discussed above is of a structure, in which the apparent melt viscosity of the first thermotropic liquid crystal polymer film at the frequency of 1 Hz is out of the predetermined range as defined by the present invention and, therefore, the appearance, the resin flow resistance and the bondability after the lamination were found unsatisfactory if the apparent melt viscosity is lower than $1\times10^4$ Pa-s, but the bondability was found unsatisfactory if the apparent melt viscosity is higher than $2\times10^5$ Pa-s. Also, although the laminates according to Comparative Examples 4 and 5, respectively, exhibit the same melting point, the setting of the laminating temperature based on the conventional melting point results in an increase of the frequency of occurrence of imperfect products where the films having the apparent melt viscosity different from each other are employed.

TABLE 6

| | Film | | | Film Physical Characteristic at Laminating Temp. | | Appearance | | | |
|---|---|---|---|---|---|---|---|---|---|
| | Type | Melt. Point ° C. | Laminating Temp. ° C. | Freq. Hz | Apparent Melt Viscosity Pa-s | after Lamination | Resin Flow Resistance | Bondability | Yield(*) |
| Ex. 1 | A1 | 280 | 275 | 1 | $4\times10^4$ | ○ | ○ | ○ | 5/5 |
| | A2 | 280 | 260 | 1 | $5\times10^4$ | ○ | ○ | ○ | |
| | A3 | 280 | 278 | 1 | $8\times10^4$ | ○ | ○ | ○ | |
| | A4 | 280 | 279 | 1 | $2\times10^5$ | ○ | ○ | ○ | |
| | A5 | 280 | 275 | 1 | $6\times10^4$ | ○ | ○ | ○ | |
| Ex. 2 | B1 | 280 | 265 | 1 | $2\times10^5$ | ○ | ○ | ○ | 1/1 |
| Ex. 3 | C1 | 325 | 295 | 1 | $1\times10^5$ | ○ | ○ | ○ | 1/1 |
| Ex. 4 | E1 | 325 | 310 | 1 | $1\times10^5$ | ○ | ○ | ○ | 1/1 |
| Com. Ex. 1 | A1 | 280 | 300 | 1 | $4\times10^2$ | X | X | ○ | 0/1 |
| Com. Ex. 2 | B1 | 280 | 250 | 1 | $6\times10^5$ | ○ | ○ | X | 0/1 |
| Com. Ex. 3 | C1 | 280 | 330 | 1 | $8\times10^3$ | X | X | ○ | 0/1 |
| Com. Ex. 4 | A1 | 280 | 275 | 1 | $4\times10^4$ | ○ | ○ | ○ | 3/5 |

TABLE 6-continued

|  | Film | | | Film Physical Characteristic at Laminating Temp. | | Appearance after Lamination | Resin Flow Resistance | Bondability | Yield(*) |
|---|---|---|---|---|---|---|---|---|---|
|  | Type | Melt. Point °C. | Laminating Temp. °C. | Freq. Hz | Apparent Melt Viscosity Pa-s | | | | |
| Com. Ex. 5 | A2 | 280 | 275 | 1 | $7 \times 10^3$ | X | X | ○ | 3/5 |
|  | A3 | 280 | 275 | 1 | $2 \times 10^5$ | ○ | ○ | ○ |  |
|  | A4 | 280 | 275 | 1 | $3 \times 10^5$ | ○ | ○ | X |  |
|  | A5 | 280 | 275 | 1 | $6 \times 10^4$ | ○ | ○ | ○ |  |
|  | C1 | 325 | 295 | 1 | $1 \times 10^5$ | ○ | ○ | ○ |  |
|  | C2 | 325 | 295 | 1 | $4 \times 10^4$ | ○ | ○ | ○ |  |
|  | C3 | 325 | 295 | 1 | $3 \times 10^5$ | ○ | ○ | X |  |
|  | C4 | 325 | 295 | 1 | $7 \times 10^4$ | ○ | ○ | ○ |  |
|  | C5 | 325 | 295 | 1 | $8 \times 10^3$ | X | X | ○ |  |

(*)Yield = (Number of Acceptable Products)/(Number of Products Evaluated)

What is claimed is:

1. A method of making a wiring board, comprising:
measuring an apparent melt viscosity of a thermotropic liquid crystal polymer of a thermotropic liquid crystal polymer film on a lot to lot basis; and
if the measured apparent melt viscosity of a lot is not in the range of from $1 \times 10^4$ to $2 \times 10^5$ Pa-s at a temperature from 240 to 350° C., heat treating the thermotropic liquid crystal polymer film of the lot not in the range to adjust the apparent melt viscosity of the thermotropic liquid crystal polymer of the heat treated lot to a value in the range of from $1 \times 10^4$ to $2 \times 10^5$ Pa-s, at a temperature from 240 to 350° C.;
then laminating the thermotropic liquid crystal polymer film on a wiring board material having one layer, containing an exposed electroconductive circuit; and
hot pressing the thermotropic liquid crystal polymer film and the wiring board material having one layer together to provide the wiring board;
wherein
a temperature of the hot pressing is a temperature in the range from 240 to 350° C., and
the apparent melt viscosity is measured at a frequency of 1 Hz.

2. The method as claimed in claim 1, wherein a temperature of the heat treatment is equal to or higher than a melting point of the thermotropic liquid crystal polymer or at a temperature within a range of a value lower by 20° C. than the melting point to a value equal to the melting point of the thermotropic liquid crystal polymer.

3. The method as claimed in claim 1, wherein the wiring board material comprises a base material polymer, which is a thermotropic liquid crystal polymer, and
the apparent melt viscosity of the thermotropic liquid crystal polymer of the thermotropic liquid crystal polymer film is lower than the apparent melt viscosity of the thermotropic liquid crystal polymer of the wiring board material at the hot pressing temperature.

4. The method as claimed in claim 1, wherein
the thermotropic liquid crystal polymer film hot pressed to the wiring board is a laminated film having at least two layers,
an apparent melt viscosity of the thermotropic liquid crystal polymer forming a film adjoining the wiring board material, is lower than an apparent melt viscosity of the thermotropic liquid crystal polymer film of the other of the at least two layers, and
the apparent melt viscosity of the thermotropic liquid crystal polymer film adjoining the wiring board material is within the range of $1 \times 10^4$ to $2 \times 10^5$ Pa-s.

5. The wiring board making process as claimed in claim 1, wherein the apparent melt viscosity of the thermotropic liquid crystal polymer and/or film is measured on a lot-by-lot basis, wherein the thermotropic liquid crystal polymer and/or film has no substantial difference in melting point on a lot-by-lot basis.

* * * * *